US006532557B1

(12) United States Patent
Wong et al.

(10) Patent No.: US 6,532,557 B1
(45) Date of Patent: Mar. 11, 2003

(54) METHOD AND APPARATUS FOR IMPROVING FAULT TEST COVERAGE FOR AN INTEGRATED CIRCUIT

(75) Inventors: Mark Wong, Union City, CA (US); Philip Hurlow, Danville, CA (US)

(73) Assignee: Silicon Motion, Inc., San Jose, CA (US)

( * ) Notice: Subject to any disclaimer, the term of this patent is extended or adjusted under 35 U.S.C. 154(b) by 0 days.

(21) Appl. No.: 09/405,521

(22) Filed: Sep. 23, 1999

(51) Int. Cl.[7] .............................................. G01R 31/28
(52) U.S. Cl. ...................................................... 714/724
(58) Field of Search ................................ 714/724, 726, 714/727, 734, 732, 736, 733, 30, 744, 710–711, 719, 740, 743; 324/73.1; 326/41, 101, 39–40; 327/565, 230.03, 222; 365/63, 200–201, 230.06, 236, 194, 225.7; 703/28; 716/4; 710/305; 707/531

(56) References Cited

U.S. PATENT DOCUMENTS

| 4,125,868 A | * | 11/1978 | Hruby et al. ................. 707/531 |
| 5,115,191 A | * | 5/1992 | Yoshimori .................... 714/724 |
| 5,208,778 A | * | 5/1993 | Kumanoya et al. .......... 365/201 |
| 5,331,571 A | * | 7/1994 | Aronoff et al. .............. 324/73.1 |
| 5,442,641 A | * | 8/1995 | Beranger et al. ............ 714/719 |
| 5,541,935 A | * | 7/1996 | Waterson ...................... 714/30 |
| 5,596,538 A | * | 1/1997 | Joo ............................... 365/194 |
| 5,648,973 A | * | 7/1997 | Mote, Jr. ...................... 714/727 |
| 6,081,916 A | * | 6/2000 | Whetsel, Jr. ................. 714/727 |
| 6,144,592 A | * | 11/2000 | Kanda ........................... 365/200 |

* cited by examiner

Primary Examiner—Albert Decady
Assistant Examiner—Guy Lamarre
(74) Attorney, Agent, or Firm—Blakely, Sokoloff, Taylor & Zafman LLP

(57) ABSTRACT

An integrated circuit is disclosed that includes an output pad, a first functional unit block (FUB) coupled to the output pad and a control circuit coupled to the first FUB. According to one embodiment, the control circuit is adaptable to select a first group or a second group of internal signals within the first FUB that are to be transmitted to the output pad upon initiating a test mode at the integrated circuit. According to a further embodiment, the control circuit is further adaptable to receive a test vector including data that determines whether the first or second group of internal signals are transmitted to the output pad. According to yet another embodiment, the integrated circuit includes a second FUB coupled to the output pad and the control circuit. The control circuit is adaptable to select between a third group of internal signals and a fourth group of internal signals within the second FUB that are to be transmitted to the output pad.

21 Claims, 4 Drawing Sheets

METHOD AND APPARATUS FOR IMPROVING FAULT TEST COVERAGE FOR AN INTEGRATED CIRCUIT

FIELD OF THE INVENTION

The present invention relates to testing the accuracy of integrated circuits; more particularly, the present invention relates to increasing test coverage for integrated circuit systems.

BACKGROUND

As the technology for manufacturing integrated circuits advances, increasingly more logic functions may be included in a single integrated circuit device. Modem integrated circuit (IC) devices include over 100,000 gates on a single semiconductor chip, with these gates interconnected so as to perform multiple and complex functions, such as, for example, those in a graphics controller (or processor). The manufacture of such circuits incorporating such Very Large Scale Integration (VLSI) requires that the fabrication of the circuit be error free, as manufacturing defects may prevent the IC from performing all of the functions that it is designed to perform. Thus, verification of the circuit design, as well as various types of electrical testing, is required after manufacture.

In an IC test system, a test signal pattern called a test vector is provided to an IC device under test conditions and a resultant output from the semiconductor device is compared with an expected signal established in advance to determined whether the semiconductor device under test works correctly or not. A test vector describes the desired test input (or signals), associated clock pulse (or pulses), and expected test output (or signals) for every IC package pin during a period of time, often in an attempt to "test" a particular gate (or macro). For complex circuitry, however, this may involve a large number of test vectors and accordingly a long test time.

As the complexity of all IC increases, so does the cost and difficulty of verifying and electrically testing each of the devices in the IC. From an electrical test standpoint, in order to totally verify that each gate in a VLSI circuit functions properly, test coverage must be performed on each of the gates not only individually (in the digital sense, determining that it is neither stuck-open nor stuck-closed), but also in conjunction with the other gates in the circuit in all possible combinations of operations. This is normally accomplished by automated testing equipment (ATE) that employs test vectors to perform the desired tests.

FIG. 1 is a block diagram of an exemplary IC test system. The IC system includes two functional unit blocks (FUB 1 and FUB 2) within an IC, each coupled to an input pad and an output pad. Before testing the IC, separate test vectors must be created for each FUB in the IC. The test vector generated for FUB 1 is transmitted to FUB 1 via the input pad. The logic gates within FUB 1 are manipulated according to the content of the test vector. Afterwards, output signals that correspond with the transactions carried out inside the FUB 1 are transmitted to the output pad. Finally, the output signals are compared with an expected test outcome. Subsequently, the same process is carried out for FUB 2.

One problem with exemplary IC test systems is that the actual input signals within a FUB cannot be directly monitored; only the results of the execution of the signals may be observed. For example, the output of a counter within a FUB may be viewed at the output pad. However, the individual pulses generated by the counter may not be monitored. Therefore, there is no way to verify that the output of the counter is activated under the designed conditions. In addition, a lot of time may elapse between the inputting of a test vector into an FUB and the resulting output to propagate to the output pad. For instance, it may be necessary to wait thousands of clock cycles in order to observe output signals after a test vector has been fed to a FUB. Further, test vectors must be repeatedly loaded for each FUB within an IC. As described above, FUB 1 must be completely tested before a test vector may be loaded to test FUB 2.

Yet another problem with exemplary IC test systems is that specific circuit configurations within a FUB may have some of its gates inaccessible for all but a special combination of signals, thereby hiding a fault unless a very specific pattern of signals is presented. However, the cost of test that covers 100% of an IC using exemplary IC test methods is very expensive. The excessive expense is due to the high cost of test equipment required to exercise each circuit in the IC. In addition, a lot of time is necessary in order to create the requisite test vectors to test the IC. Further, it is very time-consuming to execute a test vector that examines each possible combination to each gate in the IC. Consequently, integrated circuit manufacturers must currently test less than all of the active devices in an IC, resulting in quality levels of the product being less than optimal. Therefore, a method and apparatus for improving fault coverage and reducing the time to execute a system IC test is desired.

SUMMARY OF THE INVENTION

An integrated circuit is disclosed that includes an output pad, a first functional unit block (FUB) coupled to the output pad and a control circuit coupled to the first FUB. According to one embodiment, the control circuit is adaptable to select a first group or a second group of internal signals within the first FUB that are to be transmitted to the output pad upon initiating a test mode at the integrated circuit. According to a further embodiment, the control circuit is further adaptable to receive a test vector including data that determines whether the first or second group of internal signals are transmitted to the output pad.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

Figure 1:
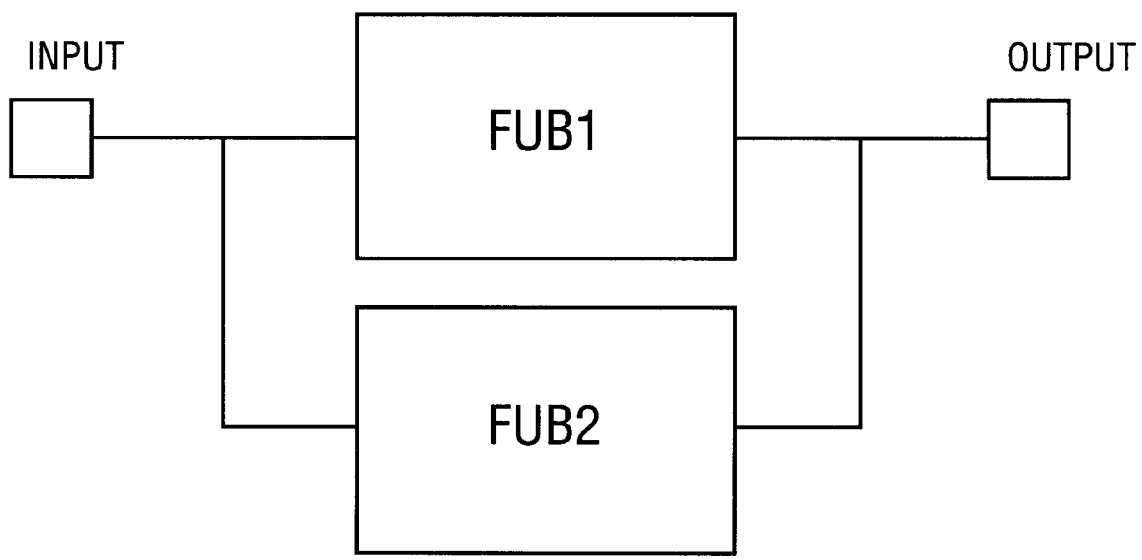
FIG. 1 is a block diagram of an exemplary integrated circuit test system.
Figure 2:
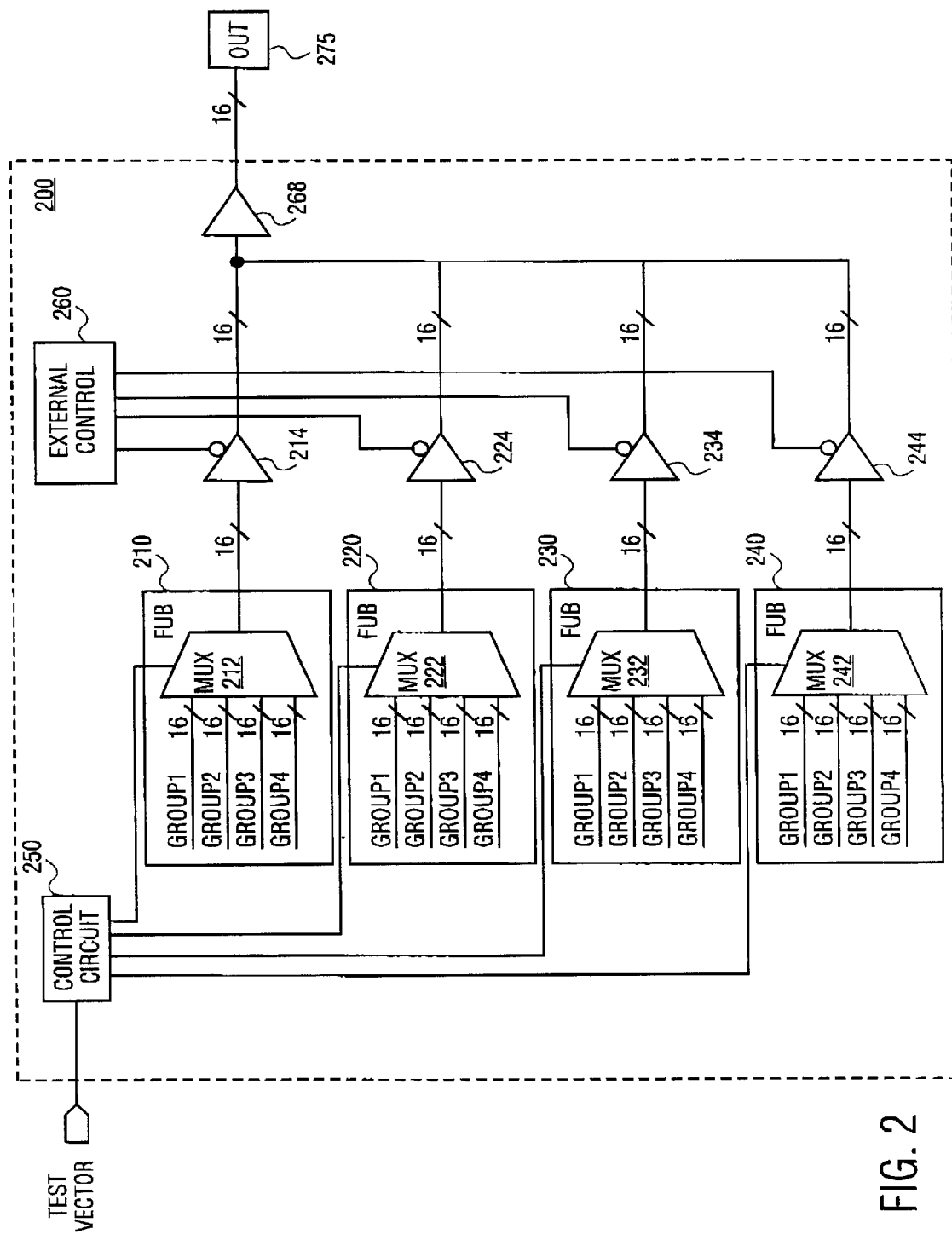
FIG. 2 is a block diagram of one embodiment of an integrated circuit test system.

FIG. 2 is a block diagram of one embodiment of an integrated circuit (IC) tester system 200. The IC tester system 200 is typically a monolithic semiconductor IC containing circuits which are to be tested and used after testing and these circuits include functional unit blocks. IC tester system 200 is coupled to output pins 275 which are usually the output pins of the IC. Output pins 275 receive data generated by IC tester system 200 during a fault test. Output pins 275 are adapted to receive the maximum number of signals that may be generated and transmitted from IC tester system 200 at any given time. During the normal operation of the IC, output pins 275 are used for normal input/output functions (e.g., data or address pins).

IC tester system 200 includes functional unit blocks (FUBs) 210, 220, 230 and 240. However, in other embodiments, a different number of FUBs may be included in IC tester system 200. IC tester system 200 also includes control circuit 250 and external control unit 260. Control circuit 250 is coupled to each of the FUBs, while external control unit 260 is coupled to tri-state buffers 214, 224, 234 and 244. Tri-state buffers 214, 224, 234 and 244 are coupled to FUBs 210, 220, 230, and 240, respectively. In other embodiments, however, the tri-state buffers may be included within each respective FUB.

Further, IC tester system 200 includes an output drivers 268. Output drivers 268 are coupled between tri-state buffers 214–244 and output pins 275. Output drivers 268 amplify test data signals received from the tri-state buffers before transmitting the data to output pins 275. Output drivers 268 are also adaptable to receive the maximum number of signals transmitted from the FUBs at any given time.

External control unit 260 determines which FUB controls the output flow path (i.e., transmits test signals to output pins 275) during an IC test. External control unit 260 directs the flow of test data from a FUB to output pins 275 by manipulating the FUB's respective tri-state buffer. For example, in order for data to be transmitted from FUB 210 to output pins 275, tri-state buffer 214 must have been activated by external control unit 260. According to one embodiment, only one PUB may transmit data to output pins 275 at any given time. Thus, while one FUB is transmitting data, all of the other FUBs are precluded from transmitting data by having their respective tri-state buffers deactivated.

Figure 3:
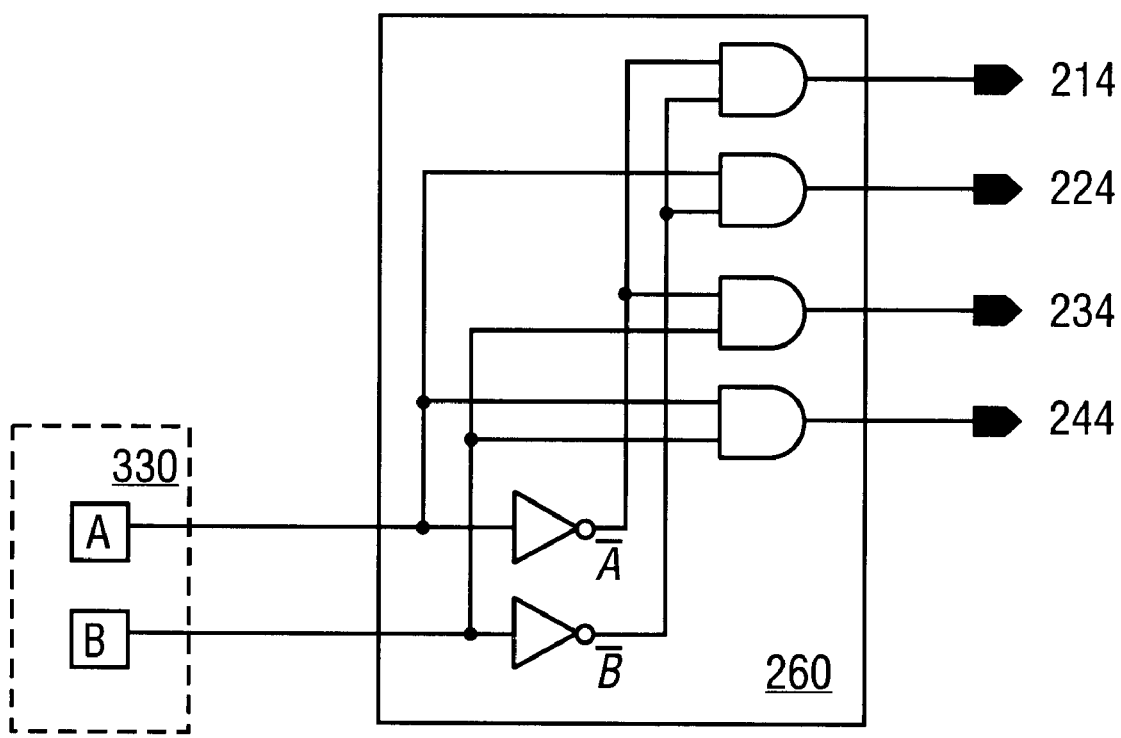
FIG. 3 is a block diagram of one embodiment of an external control circuit.

FIG. 3 is a block diagram of one embodiment of external control unit 260 implemented using demultiplexer (or decoder) circuitry. However, external control unit 260 may be implemented using other select circuitry. External control unit 260 is coupled to select pins 330. In this embodiment, select pins 330 may comprise pins A and B that transmit data to external control unit 260 in the form of encoded signals. Pins A and B may each be tied to either a supply voltage or ground. If a pin is coupled to the supply voltage a high logic level is transmitted, and if a pin is coupled to ground a low logic level is transmitted.

Control of which FUB data is to be received from may be selected, both before and during a system test, by changing the configuration of select pins 330. For example, tri-state buffer 244 may be activated before a system test by configuring both pins A and B to transmit high logic levels, thus selecting FUB 240 to transmit test data to output pins 275. During the test, after FUB 240 has been satisfactorily tested, FUB 230 may be selected for testing by reconfiguring pin B to transmit a low logic level. As a result, tri-state buffer 244 is deactivated and tri-state buffer 234 is activated. Accordingly FUB 230 is granted control of the output flow path. One of ordinary skill in the art will appreciate that external control circuit 260 may be adapted to select between $2^n$ (where n is equal to the number of control pins 330) FUBs depending upon the particular requirements of IC test system 200.

Referring back to FIG. 2, FUBs 210, 220, 230 and 240 include multiplexers (MUX) 212, 222, 232 and 242, respectively. The MUX within each FUB is coupled to control circuit 250 and is configured to select between groups of signals within the FUB.

Each group of signals in a FUB correspond to internal signals transmitted to and received at various logic circuitry within the IC. In one embodiment, each FUB includes four groups.

Further, each group may transmit up to 16 signals at a time to be monitored at output pins 275.

In order for a particular group of signals to be transmitted to output pins 275, a MUX in the respective FUB receives a select signal from control circuit 250 choosing that group. In addition, external control unit 260 activates the tri-state buffer for that particular FUB. For example, in order for group 1 of FUB 220 to be transmitted to output pins 275, MUX 222 receives a select signal from control circuit 250 indicating that group 1 is to be transmitted.

Also, external control unit 260 activates tri-state buffer 224 in order to permit signals from FUB 220 to be passed. As a result, the 16 signals that comprise group 1 may be transmitted from FUB 220 to output pins 275. Note that in other embodiments, a different number of groups may be included within the FUBs (e.g., 1, 2, 8, 16, 32, etc.). In addition, each FUB may be configured such that the groups may contain other quantities of signals (e.g., 1, 2, 4, 8, etc.).

Control circuit 250 controls which group of signals within the FUBs are to be transmitted, provided a FUB has control of the output flow path. Control circuit 250 is adapted to receive data from a test vector used to implement the testing of an IC. Included in the test vector is data that indicates the particular groups control circuit 250 is to select at each FUB. Consequently, a particular test vector may instruct control circuit 250 to select different groups of signals to be transmitted from the various FUBs at different times during the testing of an IC. According to one embodiment, control circuit 250 may be implemented using a Time Domain Multiplex (TDM) register. However, in other embodiments, control circuit 250 may be implemented using other devices.

Figure 4:
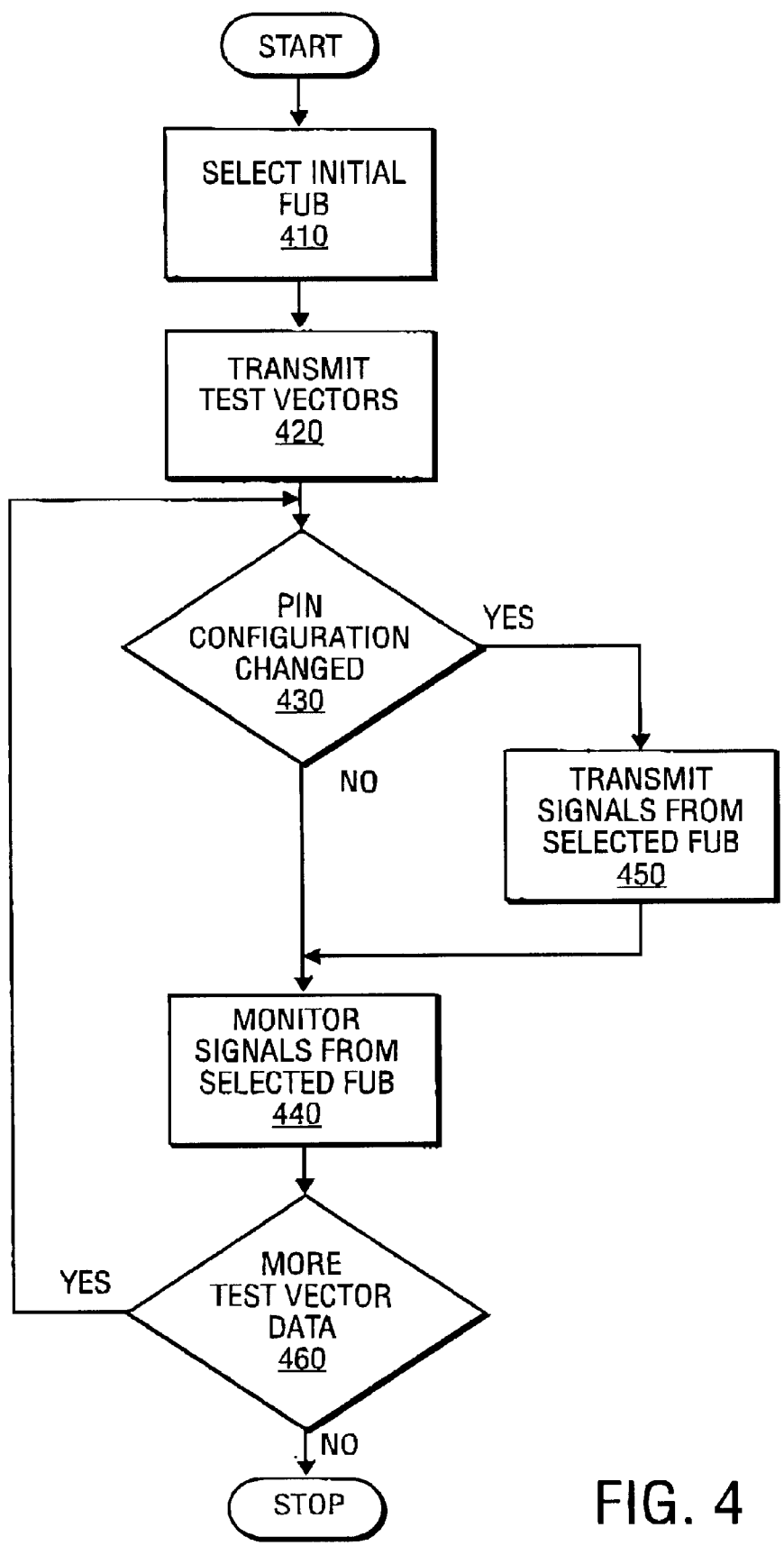
FIG. 4 is a flow diagram for one embodiment of the operation of an integrated circuit test system.

FIG. 4 is a flow diagram for one embodiment of the operation of IC test system 200. At process block 410, a FUB is initially selected for testing by configuring the pins within select pins 330. At process block 420, a test vector is transmitted to control circuit 250. Upon receiving the test vector, IC test system 200 commences operation. As described above, the test vector instructs control circuit 250 to select particular groups of signals within the FUBs for transmission. At process block 430, it is determined whether the pin configuration at select pins 330 has been changed, indicating that another FUB has been selected for monitoring. If no subsequent FUB has been selected for monitoring, the signals from the selected FUB are monitored at process block 440. As described above, signals from a selected group within a selected FUB is transmitted to output pins 275.

At process block 460, it is determined whether the test vector includes more test data to be processed. If the test vector has been completely executed, the IC system test has been completed. If, however, the test vector has not been completed, control is returned to process block 430 where it is determined whether another FUB has been selected for testing. If it is determined that another FUB has been selected for testing, control of the output path to output pins 275 is transferred to the presently selected FUB at process block 450. At process block 440, the signals from the recently selected FUB is monitored. At process block 460, it is again determined whether the test vector includes more test data to be processed.

From the description given above, one of ordinary skill in the art will appreciate that IC test system 200 significantly increases fault coverage, while reducing test development time, by providing access to internal signals of each functional unit block within an integrated circuit to be monitored at a generic output pin.

Therefore, a method and apparatus for improving fault coverage and reducing the time to execute a system IC test has been described.

What is claimed is:

1. An integrated circuit comprising:

an output pad;

a first functional unit block (FUB) coupled to the output pad; and a control circuit coupled to the first PUB that selects a first group of internal signals of a plurality of signal groups within the first FUB that are to be transmitted to the output pad in response to receiving data within a test vector indicating that the first group of signals are to be tested.

2. The integrated circuit of claim 1 wherein the control circuit selects a second group of internal signals within the first FUB that are to be transmitted to the output pad in response to receiving data within the test vector indicating that the second group of signals are to be tested.

3. The integrated circuit of claim 2 wherein the control circuit dynamically changes from the first group of signals to the second group of signals in response to receiving the data indicating that the second group of signals are to be tested.

4. The integrated circuit of claim 3 further comprising a second FUB coupled to the output pad and the control circuit that selects between a third group of internal signals and a fourth group of internal signals within the second FUB that are to be transmitted to the output pad in response to receiving data within the test vector indicating which group of signals are to be tested.

5. The integrated circuit of claim 4 further comprising:

a first tri-state buffer coupled to the first FUB and the output pad;

a second tri-state buffer coupled to the second FUB and the output pad; and a selector circuit coupled to the first and second tri-state buffers, wherein the selector circuit selects either the first or second FUB to transmit a selected group of internal signals to the output pad.

6. The integrated circuit of claim 5 further comprising a plurality of control pins coupled to the selector circuit, that transmit either a high voltage signal or a low voltage signal to the selector circuit.

7. The integrated circuit of claim 6 wherein the selector circuit receives an encoded signal from the plurality of control pins that determine whether the selector circuit selects the first FUB or the second FUB.

8. The integrated circuit of claim 3 wherein the first FUB comprises a multiplexer coupled to the control circuit that selects either the first or second group of internal signals to be transmitted to the output pad based upon receiving a control signal from the control circuit.

9. The integrated circuit of claim 1 wherein the control circuit is coupled to automated testing equipment.

10. A method of testing an integrated circuit comprising:

selecting a first of a plurality of functional unit blocks (FUBs) to be tested;

receiving a test vector at the integrated circuit;

selecting a first of a plurality of groups of signals within the first PUB to be transmitted to an output pad based upon data included within the test vector; and monitoring the first group of signals.

11. A graphics controller comprising:

an output pad; and a first functional unit block (FUB) coupled to the output pad;

a control circuit coupled to the first FUB that selects a first group of internal signals of a plurality of signal groups within the first FUB that are to be transmitted to the output pad in response to receiving data within a test vector indicating that the first group of signals are to be tested.

12. The method of claim 10 wherein selecting the first group comprises transmitting a select signal corresponding with the first group of signals from a control circuit to a multiplexer within the first FUB.

13. The method of claim 10 further comprising:

selecting a second of the plurality of groups of signals within the first FUB to be transmitted to the output pad, wherein the selection of the first group of signals is determined by data included within the test vector; and monitoring the second group of signals.

14. The method of claim 10 further comprising:

selecting a second of a plurality of functional unit blocks (FUBs);

selecting a first of a plurality of groups of signals within the second FUB to be transmitted to the output pad; and monitoring the second group of signals.

15. A graphics controller comprising:

an output pad; and a first functional unit block SUB) coupled to the output pad;

a control circuit coupled to the first FUB, that selects a first group of internal signals of a plurality of signal groups within the first FUB that are to be transmitted to the output pad in response to receiving data within a test vector indicating that the first group of signals are to be tested.

16. The graphics controller of claim 15 wherein the control circuit selects a second group of internal signals within the first FUB that are to be transmitted to the output pad in response to receiving data within the test vector indicating that the second group of signals are to be tested.

17. The graphics controller of claim 16 wherein the control circuit dynamically changes from the first group of signals to the second group of signals in response to receiving the data indicating that the second group of signals are to be tested.

18. The graphics controller of claim 15 further comprising a second FUB coupled to the output pad and the control circuit that selects between a third group of internal signals and a fourth group of internal signals within the second FUB that are to be transmitted to the output pad in response to receiving data within the test vector indicating which group of signals are to be tested.

19. The graphics controller of claim 18 further comprising:

a first tri-state buffer coupled to the first FUB and the output pad;

a second tri-state buffer coupled to the second FUB and the output pad; and a selector circuit coupled to the first and second tri-state buffers, wherein the selector circuit selects either the first or second FUB to transmit a selected group of internal signals to the output pad.

20. The graphics controller of claim 19 further comprising a plurality of control pins coupled to the selector circuit that transmit either a high voltage signal or a low voltage signal to the selector circuit.

21. The graphics controller of claim 20 wherein the selector circuit receives an encoded signal from the plurality of control pins that determine whether the selector circuit selects the first FUB or the second FUB.

* * * * *

UNITED STATES PATENT AND TRADEMARK OFFICE
CERTIFICATE OF CORRECTION

PATENT NO.     : 6,532,557 B1
DATED          : March 11, 2003
INVENTOR(S)    : Wong et al.

It is certified that error appears in the above-identified patent and that said Letters Patent is hereby corrected as shown below:

Column 6,
Line 33, please delete "PUB" and insert -- FUB --.
Line 66, please delete "SUB)" and insert -- (FUB) --.

Signed and Sealed this

Ninth Day of August, 2005

JON W. DUDAS
*Director of the United States Patent and Trademark Office*